(12) United States Patent
Namiki et al.

(10) Patent No.: US 6,582,778 B2
(45) Date of Patent: Jun. 24, 2003

(54) METHOD OF TREATMENT WITH A MICROWAVE PLASMA

(75) Inventors: Tsunehisa Namiki, Yokohama (JP); Toshihide Ieki, Yokohama (JP); Akira Kobayashi, Yokohama (JP); Koji Yamada, Yokohama (JP); Hideo Kurashima, Yokohama (JP)

(73) Assignee: Toyo Seikan Kaisha, Ltd., Tokyo (JP)

( * ) Notice: Subject to any disclaimer, the term of this patent is extended or adjusted under 35 U.S.C. 154(b) by 0 days.

(21) Appl. No.: 10/023,828

(22) Filed: Dec. 21, 2001

(65) Prior Publication Data

US 2002/0122897 A1 Sep. 5, 2002

(30) Foreign Application Priority Data

Dec. 25, 2000 (JP) .................................. 2000-392999
Jun. 7, 2001 (JP) .................................. 2001-172144

(51) Int. Cl.$^7$ ................................ H05H 1/30
(52) U.S. Cl. .................... 427/575; 427/237; 427/249.1; 427/255.18; 427/255.29; 427/255.395; 427/294; 427/296; 427/577; 427/578; 427/595

(58) Field of Search ................................. 427/575, 577, 427/578, 237, 249.1, 255.18, 255.29, 255.395, 294, 296, 595

(56) References Cited

U.S. PATENT DOCUMENTS 5,017,404 A * 5/1991 Paquet et al. .............. 427/45.1

* cited by examiner

Primary Examiner—Bernard Pianalto
(74) Attorney, Agent, or Firm—Sughrue Mion, PLLC

(57) ABSTRACT

Disclosed is a method of treatment with a microwave plasma by maintaining a reduced pressure in a plasma-treating chamber for treatment with a plasma in which a substrate that is to be treated with a microwave plasma is contained, introducing a treating gas into the plasma-treating chamber and introducing microwaves into the plasma-treating chamber, wherein a metallic antenna is disposed in the plasma-treating chamber. The plasma is generated within a very short period of time maintaining stability after the microwaves are introduced into the plasma-treating chamber, and the treatment is accomplished maintaining stability.

17 Claims, 7 Drawing Sheets

METHOD OF TREATMENT WITH A MICROWAVE PLASMA

BACKGROUND OF THE INVENTION

1. Field of the Invention

The present invention is related to a method of treatment with a microwave plasma. More specifically, the invention is related to a method of treatment with a microwave plasma, which is capable of forming a plasma in a short period of time maintaining stability in conducting the treatment with a microwave plasma in order to chemically deposit a film on a substrate.

2. Description of the Related Art

The chemical vapor deposition (CVD) is a technology for precipitating a reaction product like a film on the surface of a substrate relying upon the vapor growth in a high-temperature atmosphere by using a starting material gas that does not undergo a reaction at normal temperature. The CVD has been widely employed for the manufacture of semiconductors and for reforming the surfaces of metals and ceramics. In recent years, the CVD has been employed even for reforming the surfaces of plastic containers and, particularly, for improving gas barrier properties.

A plastic container having a deposited carbon film has been know already as a plastic material with a chemically deposited film.

Japanese Unexamined Patent Publication (Kokai) No. 53116/1996 discloses a plastic container coated with a carbon film characterized in that a hard carbon film is formed on the inner wall surface of a container formed of a plastic material.

The plasma CVD is a process for growing a thin film by utilizing a plasma. That is, the plasma CVD basically comprises decomposing a gas containing a staring material gas with electric energy of an intense electric field under a reduced pressure, to deposit, on a substrate, a substance that is formed through a chemical reaction in the gaseous phase or on the substrate.

The plastic state is realized by a glow discharge. Depending upon the systems of the glow discharge, there have been known a method that utilizes a DC glow discharge, a method that utilizes a high-frequency glow discharge and a method that utilizes a microwave discharge.

In the coated plastic container based upon the above-mentioned prior art, a carbon film is deposited on the inner wall surface of the container based on the high-frequency glow discharge by using a so-called capacity-coupled CVD apparatus having an internal electrode arranged in the container and an external electrode arranged outside the container accompanied, however, by such problems that the constitution of the apparatus is complex and the operation becomes complex, too.

With the microwave plasma CVD which utilizes a microwave discharge in a chamber, on the other hand, neither the external electrode nor the internal electrode is necessary, and the apparatus can be constituted very simply. Besides, the pressure in the apparatus needs be reduced to such a degree that the microwave electric discharge generates in the plastic container only, and there is no need of maintaining a high degree of vacuum in the whole apparatus offering advantages such as easy operation and excellent productivity.

According to the study conducted by the present inventors, however, the treatment with a microwave plasma involves a considerable degree of time lag (for example, about 10 seconds) between the introduction of microwaves and the generation of plasma, the time lag being not constant but subject to change to a considerable degree depending upon each treatment. Therefore, difficulty is involved in controlling the treatment conditions and the effect of treatment is not stable, either.

SUMMARY OF THE INVENTION

It is therefore an object of the present invention to provide a method of treatment with a microwave plasma, which is capable of forming a plasma in a short period of time maintaining stability in conducting the treatment with a microwave plasma, i.e., capable of generating a plasma within a very short period of time from when the microwaves are introduced into a chamber for treatment with a plasma, the state of the generated plasma being stable, and of stably conducting the treatment.

Another object of the present invention is to provide a method of treatment with a microwave plasma capable of forming a film having particularly excellent gas shut-off property (gas barrier property) on, for example, the inner surface and/or the outer surface of the container.

According to the present invention, there is provided a method of treatment with a microwave plasma by maintaining a reduced pressure in a plasma-treating chamber for treatment with a plasma in which a substrate that is to be treated is contained, introducing a treating gas into the plasma-treating chamber and introducing microwaves into the plasma-treating chamber, wherein a metallic antenna is disposed in the plasma-treating chamber to generate a plasma in a short period of time maintaining stability.

According to the method of the present invention, it is desired that:

1. The metallic antenna has a length which is not smaller than 0.02 times as long as the wavelength of the microwaves;
2. A supply pipe for supplying a treating gas is extending in the plasma-treating chamber, the metallic antenna is so disposed as to be directed outward from an end of the supply pipe;
3. Use is made of a metallic pipe for supplying a treating gas, the pipe being also used as a metallic antenna;
4. The substrate to be treated is a plastic substrate;
5. The treating gas is a carbon-source gas or a gas containing an organosilicon compound and oxygen;
6. The substrate to be treated is a plastic container, the interior and/or the exterior of the plastic container is maintained in a reduced-pressure atmosphere containing a treating gas, and a microwave discharge is produced inside of the container and/or outside of the container in order to chemically deposit a film on the inner surface of the container and/or on the outer surface of the container;
7. The plastic container is held in the plasma-treating chamber, the exterior of the plastic container and the interior of the plastic container are maintained in an air-tight state, the interior of the plastic container is maintained in a reduced-pressure condition in which a microwave discharge takes place in a state where a treating gas is introduced into the plastic container, the exterior of the plastic container is maintained in a reduced-pressure condition in which no microwave discharge takes place in a state where the treating gas is introduced into the plastic container, and microwaves are introduced into the exterior of the plastic container in the plasma-treating chamber; and
8. A microwave reflector is disposed in the plasma-treating chamber so as to be opposed to the bottom of the plastic container.

In the present invention, further, it is desired that an end of the metallic antenna is positioned on an extension in the horizontal direction from an upper end or a lower end of a microwave introduction port formed in the plasma-treating chamber, or in the vicinity thereof.

It is further desired that on the surface of the metallic antenna is formed a film of the same kind as the film formed on the surface of the substrate by the treatment with a plasma. This effectively avoids a drop in the performance of the film on the surface of the substrate caused by sputtering that occurs during the treatment with a plasma.

In the present invention, further, it is desired that the supply pipe for supplying a treating gas is a porous pipe such as the one formed of a porous material having, for example, a nominal filtering precision of from 1 to 300 $\mu$m and a pressure loss on the secondary side under the atmospheric pressure of from 0.01 to 25 KPa. By using such a porous pipe, it is allowed to form a film having excellent gas barrier property on the surface of the substrate. The nominal filtering precision stands for one of the characteristic values employed when a porous material is used as a filter. For example, a nominal filtering precision of 130 $\mu$m stands for that when the porous material is used as the filter, foreign matters having particle diameters of not smaller than 130 $\mu$m can be trapped.

DETAILED DESCRIPTION OF THE INVENTION

Figure 1:
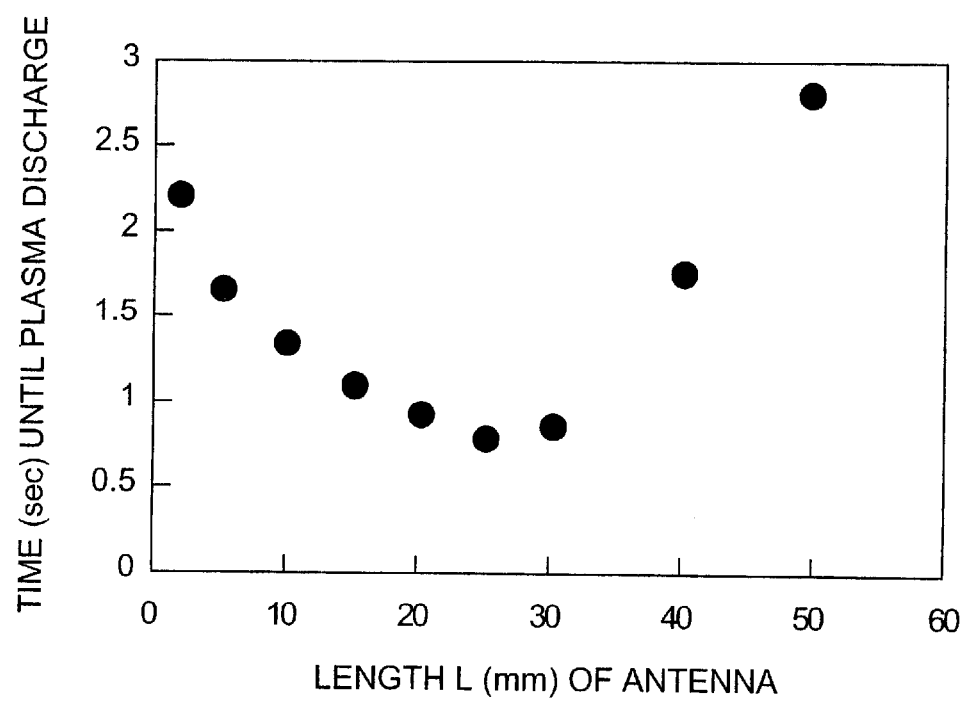
FIG. 1 is a graph plotting a relationship between the length (mm) of an antenna and an induction period (sec) until a plasma discharge is generated when microwaves of a frequency of 2.45 GHz are used.

According to the present invention, the treatment is conducted with a microwave plasma by maintaining a reduced pressure in a plasma-treating chamber in which a substrate that is to be treated is contained, introducing a treating gas into the plasma-treating chamber and introducing microwaves into the plasma-treating chamber, wherein a metallic antenna is disposed in the plasma-treating chamber to generate a plasma in a short period of time maintaining stability.

According to the present invention, the treatment with a microwave plasma is conduted by utilizing a plasma generated by a glow discharge like any other treatment with plasma.

In general, a gas is an insulator but exhibits electric conductivity as the neutral molecules thereof are ionized. This state is called gaseous electric discharge. The gaseous electric discharge can roughly be divided into a corona discharge, a glow discharge and an arc discharge depending upon the type of electric discharge.

Among them, the corona discharge stands for the one in a state where the electric discharge is locally sustaining in a non-uniform electric field such as an electric field established by an electrode having a sharp end, whereas the glow discharge and the arc discharge are those which take place in a uniform electric field.

Compared to the arc discharge, the glow discharge shines less brightly, heats the gas at a lower temperature, and produces a smaller discharge current density, but takes place stably in a gas of a low pressure making a difference.

In a general glow discharge, gaseous ions that exist in small amounts in a dark current region are gradually accelerated with an increase in the electrode voltage, come into collision with neutral molecules to ionize them, whereby the newly formed electrons further ionize other molecules, and the cations impinge upon the surface of the cathode to release electrons therefrom. Repetition of this cycle develops progressively and reaches a steady state called glow discharge where the formation of electron maintains a balance with the extinction of ions due to diffusion and recombination. A mechanism for generating a glow discharge in the treatment with a microwave plasma is the same as the above-mentioned mechanism with the exception of introducing microwaves instead of applying a voltage to the electrode.

In the case of the treatment with a microwave plasma, however, there exists an induction period between when the microwaves are introduced and when the glow discharge is generated. For example, the induction period becomes as long as 10 seconds when the microwave output is 960 watts and the degree of vacuum is 100 Pa, and it often happens that no electric discharge takes place within the treating time.

On the other hand, when a metallic antenna is disposed in the plasma-treating chamber according to the present invention, the induction period can be shortened to be several seconds or less as will be demonstrated by examples appearing later and, besides, the induction period is stabilized, which are unexpected effects of the present invention.

It is considered that a reduction in the induction period according to the present invention is closely related to the promotion of a glow discharge due to electrons which are released. In practice, the present inventors have observed that the antenna mounted in the plasma-treating chamber is heated at a considerably high temperature, from which it is implied that thermoelectrons are emitted from the antenna and, besides, electrons are emitted due to bombardment of cations upon the fine wire.

According to the present invention as described above, the plasma can be formed in a short period of time and stably in conducting the treatment with a microwave plasma, i.e., the plasma can be generated within a very short period of time from when the microwaves are introduced into the plasma-treating chamber, the plasma that is generated remaining stable making it possible to stably conduct the treatment.

Besides, the induction period for generating the plasma is shortened and becomes constant, making it possible to improve efficiency of the treatment with a plasma and to correctly and easily control the step of treatment with a plasma.

In the present invention, it is desired that the length L of the metallic antenna is set to be not smaller than 0.02 times as great as the wavelength of the microwaves from the standpoint of shortening the induction period until the plasma discharge takes place.

In FIG. 1 in the accompanying drawings is plotted a relationship between the length L (mm) of a fine metal wire (needle) and the induction period (sec) until the plasma discharge takes place when there are used microwaves of a frequency of 2.45 GHz.

FIG. 1 shows an interesting fact in that the induction period includes a minimum portion concerning the length of the fine wire, and the minimum portion corresponds to one-fourth of the wavelength $\lambda$ of the microwaves.

Namely, it is obvious that the induction period for the plasma discharge can be minimized by so selecting the length L of the fine metal wire as to establish a resonating relationship with the microwaves.

[Apparatus for Treatment with a Plasma and Method]

The apparatus used for the invention includes a plasma-treating chamber in which a substrate that is to be treated is contained, an exhaust system for maintaining the plasma-treating chamber in a reduced-pressure condition, a treating gas introduction system for introducing the reacting gas into the plasma-treating chamber, and a microwave introduction system for generating a plasma in the plasma-treating chamber, wherein a metallic antenna is disposed in the plasma-treating chamber.

Figure 2:
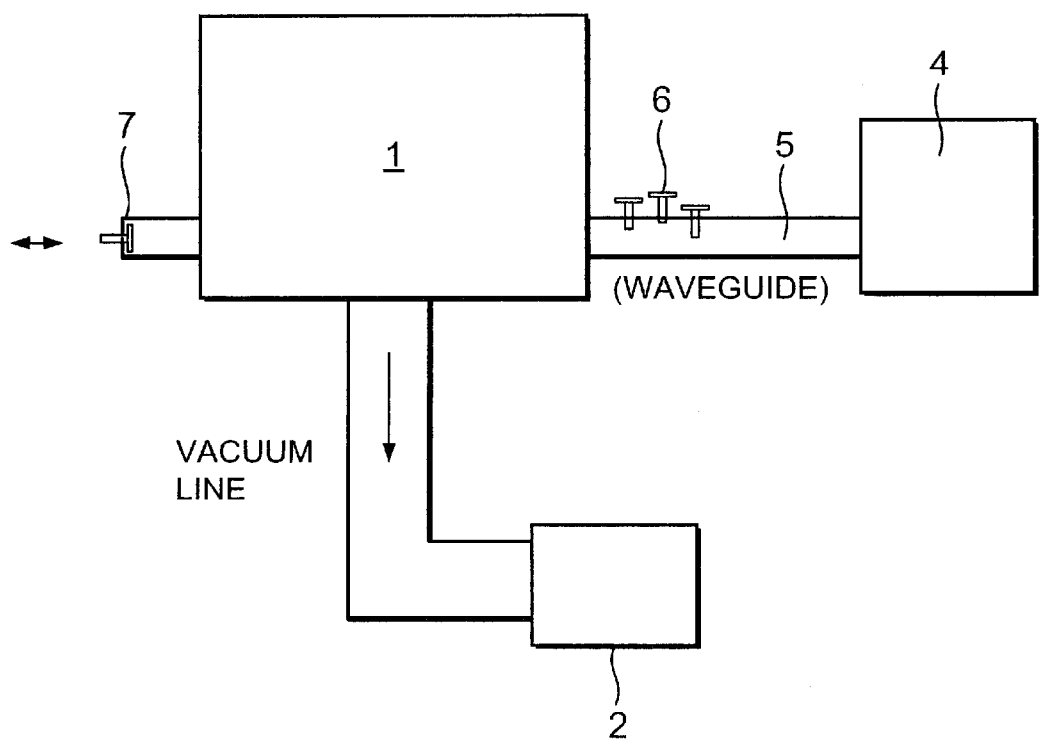
FIG. 2 is a diagram schematically illustrating the arrangement of an apparatus for treatment with a microwave plasma used for the present invention.

Reference is now made to FIG. 2 which schematically illustrates the arrangement of the apparatus for treatment with a plasma used in the present invention. The plasma-treating chamber generally designated at 1 is connected, via an exhaust pipe 2, to a vacuum pump 2 for maintaining a reduced pressure in the plasma-treating chamber 1, and is further connected to a microwave oscillator 4 via a waveguide 5.

In this embodiment, the waveguide 5 is provided with a triple tuner 6 for minimizing the amount of reflection of microwave from the plasma-treating chamber. The plasma-treating chamber 1 is provided with a short plunger 7 for adjusting the load of the plasma-treating chamber.

Figure 3:
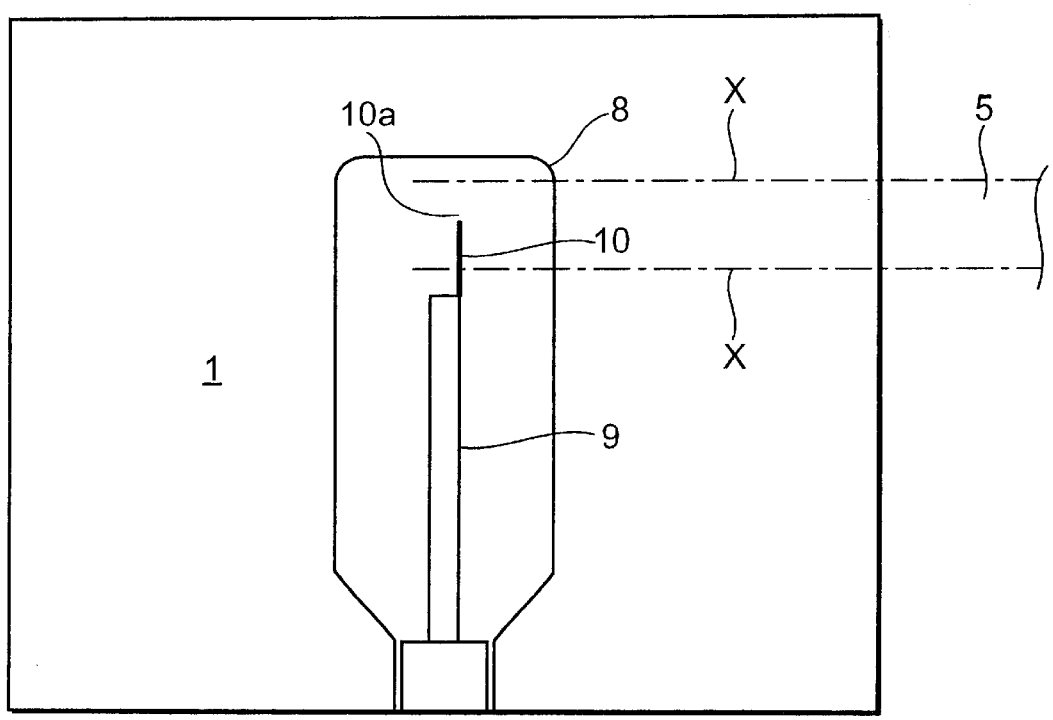
FIG. 3 is a diagram illustrating the arrangement in a chamber for treatment with a plasma of FIG. 2.

Referring to FIG. 3 illustrating an arrangement in the plasma-treating chamber 1, a bottle 8, in this case, is treated with a plasma, the bottle 8 being held upside down in the plasma-treating chamber. A supply pipe 9 is inserted in the bottle 8 for supplying a treating gas, and a metallic antenna 10 is extending upward from an end of the pipe 9.

To conduct the treatment with a plasma, the bottle 8 to be treated is, first, mounted on a bottle holder (not shown). The bottle 8 and the bottle holder are maintained in an air-tight state, and a vacuum pump 2 is driven to maintain the interior of the bottle 8 in a vacuum state. Here, in order to prevent the bottle 8 from being deformed by the external pressure, the pressure may be reduced in the plasma-treating chamber 1 outside the bottle.

The degree of pressure reduction in the bottle 8 achieved by the vacuum pump 2 is such that the treating gas is introduced and the microwaves are introduced to generate a glow discharge. On the other hand, the degree of pressure reduction in the plasma-treating chamber 1 is such that the glow discharge is not generated despite the microwaves are introduced.

After the reduced pressure conditions have been accomplished, the treating gas is introduced into the bottle 8 from the treating gas supply pipe 9, and microwaves are introduced into the plasma-treating chamber 1 via the waveguide 5. According to the present invention at this moment, a plasma is stably generated within a very short period of time due to the glow discharge since electrons are emitted from the metallic antenna 10.

The temperature of electrons in the plasma is several tens of thousands of degrees in K whereas the temperature of the gaseous ions is several hundreds of degrees in K, which is about one-hundredth, creating a thermally non-equilibrium state and making it possible to effectively treat even a plastic substrate of a low temperature with a plasma.

After the predetermined treatment is conducted with a plasma, neither the treating gas nor the microwaves are introduced, the air is gradually introduced through the exhaust pipe 3, the pressures inside and outside of the container are brought to normal pressure, and the bottle treated with a plasma is taken out of the plasma-treating chamber 1.

[Substrate to be Treated]

In the present invention, the substrate to be treated may be made of plastic materials or ceramics.

As the plastic material, there can be used thermoplastic resins that have been known per se, i.e., such as low-density polyethylene, high-density polyethylene, polypropylene, poly 1-butene, poly 4-methyl-1-pentene or polyolefins as random or block copolymers of α-olefins, ethylene, propylene, 1-butene, 4-methyl-1-pentene; ethylene-vinyl compound copolymers such as ethylene-vinyl acetate copolymer, ethylene-vinyl alcohol copolymer, and ethylene-vinyl chloride copolymer; styrene resins such as polystyrene, acrylonitrile-styrene copolymer, ABS, and α-methyl styrene-styrene copolymer; polyvinyl compounds such as polyvinyl chloride, polyvinylidene chloride, vinyl chloride-vinylidene chloride copolymer, polymethyl acrylate and polymethyl methacrylate; polyamides such as nylon 6, nylon 6-6, nylon 6-10, nylon 11 and nylon 12; thermoplastic polyester such as polyethylene terephthalate, polybutylene terephthalate and polyethylene naphthalate; polycarbonate; polyphenylene oxide; and mixtures thereof.

As the ceramics, there can be exemplified various glasses, earthenwares, ceramics; oxide ceramics such as alumina, silica, titania and zirconia; nitride ceramics such as aluminum nitride, boron nitride, titanium nitride, silicon nitride and zirconium nitride; carbide ceramics such as silicon carbide, boron carbide, tungsten carbide and titanium carbide; boride ceramics such as silicon boride, titanium boride and zirconium boride; highly dielectric ceramics such as rutile, magnesium titanate, zinc titanate and rutile-lanthanum oxide; piezoelectric ceramics such as lead titanate; and various ferrites.

These substrates may be used as films or sheets, or may be put to the treatment with a plasma of the present invention in the form of containers such as bottles, cups and tubes or in the form of any other molded articles.

As the bottles concretely described above, there can be exemplified biaxially stretch-blow-molded bottles formed of polyester such as polyethylene terephthalate.

[Metallic Antenna]

Figure 4:
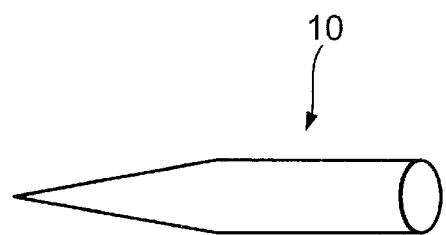
FIG. 4 is a diagram illustrating a linear antenna.
Figure 5:
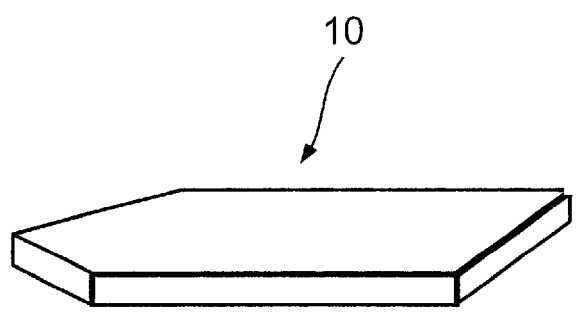
FIG. 5 is a diagram illustrating a foil-like antenna.

As the metallic antenna for shortening the induction period for glow discharge by microwaves, there can be used the one of the form of a fine wire having a sharp end as shown in FIG. 4 or the one of the form of a foil as shown in FIG. 5 having a length lying within the above-mentioned range. Desirably, the antenna of the form of a fine wire has a diameter of usually from 0.2 to 10 mm, and the antenna of the form of a foil has a width of from 1 to 10 mm and a thickness of from about 5 to about 500 $\mu$m.

The fine wire generates heat and must have excellent heat resistance. Desirably, the fine wire is made of, for example, platinum, stainless steel, copper, carbon, aluminum or steel.

In the present invention, it is desired that the metallic antenna has a length L which is not smaller than 0.02 times as great as the wavelength of the microwaves as described already. In particular, it is desired that the end of the metallic antenna is located at a portion where the electric field is intense. Referring, for example, to FIG. 3, it is desired that the end 10a of the metallic antenna is positioned on an extension (designated at X in FIG. 3) from an upper end or a lower end of a microwave introduction port (end of the waveguide 5) formed in the side surface of the plasma-treating chamber 1, or in the vicinity thereof (e.g., within ±10 mm from the extension X).

It is further desired to form, on the surface of the metallic antenna, a film of the same kind as the film formed on the surface of the substrate by the plasma-treatment. That is, in conducting the plasma-treatment, the surface of the metallic antenna is attacked by ions to develop a so-called etching phenomenon, whereby the etched substance deposits on the surface of the substrate to be treated with a plasma (this is the same phenomenon as the sputtering which is a kind of PVD method). As the sputtering occurs from the surface of the metallic antenna, the composition of the film formed on the surface of the substrate becomes inhomogeneous spoiling properties of the film, i.e., spoiling such properties as gas shut-off property and electric conductivity. Upon forming, on the surface of the metallic antenna, the film of the same kind as the film formed by the plasma-treatment, however, it is allowed to reliably prevent other elements due to sputtering from entering into the film formed on the surface of the substrate.

[Supply Pipe for Supplying a Treating Gas]

In the present invention, the supply pipe for supplying a treating gas into the plasma-treating chamber may be made of any material. It is here desired that even this pipe is coated on the surface thereof with the film of the same kind as the film formed on the surface of the substrate by the plasma-treatment like the above-mentioned metallic antenna.

Further, the pipe made of a metal can also be utilized as the metallic antenna. In this case, it is desired that the length of the metallic pipe, position of the end thereof and the diameter thereof are selected to be as those of the above-mentioned metallic antenna. By attaching a metallic antenna in the form of a fine wire or a foil to the outer side of the metallic pipe (in the direction in which the pipe extends), further, the whole pipe can be used as the metallic antenna. In this case, it is desired that the overall length, position of the end and the like are selected in the same manner as those of the above-mentioned metallic antenna.

From the standpoint of forming a film having excellent gas barrier property on the surface of the substrate, further, it is desired that the supply pipe is a porous pipe e.g., the one made of a porous material having a nominal filtering precision in a range of from 1 to 300 μm and a pressure loss on the secondary side under the atmospheric pressure in a range of from 0.01 to 25 KPa.

That is, when there is used a perforated pipe having holes of a diameter of 0.8 mm (see Reference Example 7 appearing later) or a pipe made of a porous material having a nominal filtering precision of larger than 500 μm (see Reference Example 10), the container having the film formed by the plasma-treatment exhibits an oxygen permeability of 4.8 cc and a loss of carbonic acid gas of a level of 1.4%/week. On the other hand, when there is used the porous pipe having a nominal filtering precision that lies within the above-mentioned range, the container exhibits the oxygen permeability which is suppressed to be smaller than 1 cc and a loss of carbonic acid gas which is suppressed to a level of 0.5%/week or smaller.

When the above-mentioned porous pipe is used for supplying a treating gas, it is desired that the pressure loss on the secondary side under the atmospheric pressure lies within the above-mentioned range (0.01 to 25 KPa). When the pressure loss lies outside the above-mentioned range, the gas barrier property is not so much improved.

Thus, the gas barrier property of the treated container is greatly affected by the manner of supplying a treating gas since the film chemically deposited on the container has a uniform thickness. That is, the chemically deposited film has a very small thickness and, hence, uniformity in the thickness seriously affects the gas barrier property. For example, if there exists a portion where the thickness is small despite the amount of deposition as a whole is the same, the gas permeates through the portion of a small thickness to a large extent and, as a result, the chemically deposited film as a whole exhibits decreased gas barrier property.

According to measurement really taken by the present inventors, the film (silicon oxide film) formed by the treatment with a plasma exhibited fluctuation in the thickness to a considerable degree when there is used the perforated pipe having holes 0.8 mm in diameters (Reference Example 7). However, such a fluctuation was not observed when there was used a porous pipe satisfying the above-mentioned conditions of nominal filtering precision and pressure loss.

The present inventors are aware of the problem that really occurs in that the gas is not evenly supplied onto the substrate that is to be treated with a plasma; i.e., some portions on the surface of the substrate are supplied with the gas to a sufficient degree forming the film deposited thereon but other portions on the surface of the substrate are not supplied with a sufficient amount of gas and the film is not deposited thereon at all.

That is, by using the above-mentioned porous pipe for supplying the treating gas, a predetermined pressure logs occurs as the gas passes through the pipe; i.e., the gas is uniformly blown out from the whole surface of the porous pipe and is uniformly supplied onto the whole surface of the substrate such as the container making it possible to deposit a film maintaining a uniform thickness.

Further, when a mixture of two or more kinds of gases is to be supplied like in the case of forming a silicon oxide film, a plurality of gases must be homogeneously mixed together. By using the above-mentioned porous pipe however, it is believed that he gases are homogeneously mixed together.

Figure 10:
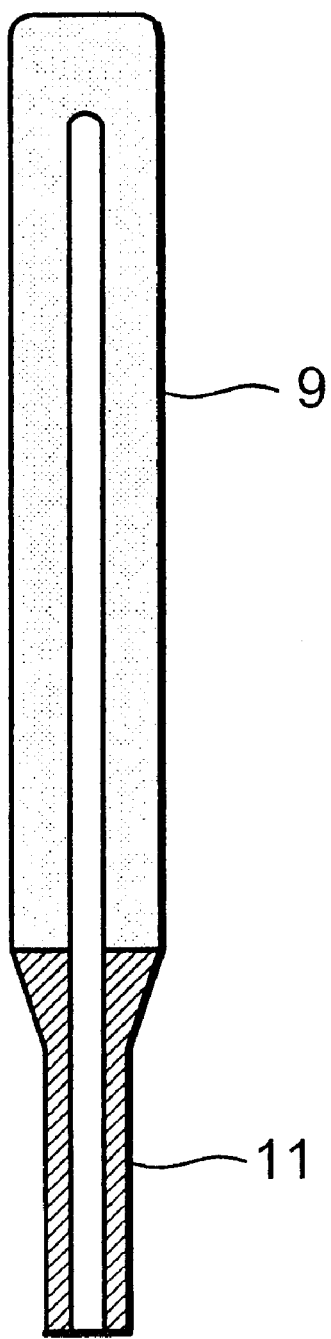
FIG. 10 is a diagram illustrating a pipe made of a porous material for supplying a treating gas preferably used in the invention.

FIG. 10 illustrates an example of the porous pipe used as the supply pipe 9 for supplying a treating gas. The supply pipe 9 comprises a porous cylindrical member with bottom having its one end welded to a hollow support member 11 and having its other end closed.

As the porous material, there can be exemplified a sintered metal such as bronze or stainless steel. The above-mentioned cylinder with bottom can be prepared by molding a bronze powder or a stainless steel powder, followed by firing. It is also allowable to prepare the cylinder by sintering it in a metal mold, as a matter of course.

Further, the porous material constituting the supply pipe 9 is not limited to the above-mentioned sintered metals only, but may be obtained by sintering and molding a plastic powder such as of polypropyrene, ultrahigh molecular-weight polyethylene and polytetrafluoroethylene (PTFE), or may be obtained by sintering and molding a ceramic material. There can be further used a porous material obtained by molding a sheet of one or a plurality kinds of fibers into the shape of a cylinder and, as required, melt-adhering portions thereof.

[Treating Gas]

As a treating gas, there can be used a variety of gases known per se depending upon the object of treatment with a plasma.

In order to reform the surface of the plastic substrate, for example, a crosslinked structure may be introduced into the surface of the plastic substrate by using a carbonic acid gas. Or properties same as those of a polytetrafluoroethylene, such as non-sticking property, low coefficient of friction, heat resistance and resistance against chemicals, nay be imparted to the surface of the plastic substrate by using a fluorine gas.

To accomplish the chemical vapor deposition (CVD), further, a compound containing atoms, molecules or ions for constituting the thin film is rendered to be in a gaseous phase and is carried by a suitable gas.

The starting compound must be highly volatile, and a carbon film or a carbide film is formed by using hydrocarbons such as methane, ethane, ethylene or acetylene. Further, a silicon film is formed by using silicon tetrachloride, silane, organosilane compound or organosiloxane compound. There can be used a halogen compound (chloride) or an organometal compound, such as titanium, zirconium, tin, aluminum, yttrium, molybdenum, tungsten, gallium, tantalum, niobium, iron, nickel, chromium or boron.

Further, an oxygen gas is used for forming an oxide film, and a nitrogen gas or an ammonia gas is used for forming a nitride film.

These starting gases can be used in two or more kinds in a suitable combination depending upon the chemical composition of the thin film that is to be formed.

As the carrier gas, on the other hand, there can be used argon, neon, helium, xenone or hydrogen.

[Treating Conditions]

In the present invention, the plasma-treating chamber must be maintained at a degree of vacuum at which a glow discharge takes place and must, in general, be maintained in a range of from 1 to 500 Pa and, particularly desirably, from 5 to 200 Pa to establish a microwave discharge to efficiently conduct the treatment with a plasma.

The amount of introducing the starting gas varies depending upon the surface area of the substrate to be treated or upon the kind of the starting gas. In treating the surfaces of the plastic container, however, it is desired that the starting gas is supplied at a flow rate of from 1 to 500 cc/min and, particularly, from 2 to 200 cc/min per a container under a standard state.

When a thin film is formed by reacting a plurality of starting gases, one starting gas may be supplied in an excess amount. For example, in forming a silicon oxide film, it is desired to supply the oxygen gas in an excess amount compared to the silicon-source gas. In forming a nitride, further, nitrogen or ammonia may be supplied in an excess amount compared to the metal-source gas.

As the microwaves for generating a glow discharge, there can be used those of frequencies that are permitted to be used industrially. In Japan, for example, it is desired to use microwaves having frequencies of 2.45 GHz, 5.8 GHz and 22.125 GHz.

The output of microwaves may differ depending upon the surface area of the substrate to be treated or the kind of the starting material gas. In treating the surfaces of the plastic container, however, it is desired that the microwaves are supplied in an electric power of from 50 to 1500 watts and, particularly, from 100 to 1000 watts per a container.

The time for treatment with a plasma varies depending upon the surface area of the substrate to be treated, thickness of the film to be formed and kind of the starting material gas, and cannot be exclusively specified. If described with reference to treating the plastic container with a plasma, however, the time of not shorter than one second per a container is necessary from the standpoint of stable treatment with a plasma. Though it is requested to shorten the time from the viewpoint of cost, the time may be of the order of minutes if necessary.

In the case of the plasma CVD, the film is favorably deposited and, besides, can be deposited on all of the surfaces.

On the other hand, when the substrate to be treated is a solid molded article like a plastic container, the interior and/or the exterior of the plastic container are maintained in a reduced pressure atmosphere containing a treating gas, and a microwave discharge is established inside of the container and/or outside of the container to chemically deposit a film on the inner surface and/or on the outer surface of the container.

In the method of treatment with a plasma shown in FIG. 3, the plastic container is held in the plasma-treating chamber, the exterior of the plastic container and the interior of the plastic container are maintained in an air-tight state, the interior of the plastic container into which the treating gas is introduced is maintained in a reduced pressure condition where a microwave discharge will take place, the exterior of the plastic container is maintained in a reduced pressure condition where the microwave discharge will not take place while introducing the treating gas into the interior of the plastic container, and microwaves are introduced into the exterior of the plastic container in the plasma-treating chamber thereby to conduct the treatment with a plasma.

In treating the solid molded article like the plastic container, it is desired to dispose a microwave reflector in the plasma-treating chamber so as to be opposed to the bottom of the plastic container, from the standpoint of stabilizing the microwave discharge and improving the treating efficiency.

EXAMPLES

The present invention will now be described in further detail, which, however, are in no way to limit the scope of the invention.

Example 1

The surface of a PP (polypropylene) film F was treated with a microwave plasma by using a microwave oscillator of a frequency of 2.45 GHz and a maximum output of 1.5 KW, a metallic cylindrical chamber for treatment with a plasma (plasma-treating chamber) having a diameter of 300 mm and a height of 300 mm, a hydraulically operated vacuum pump for evacuating the chamber and a rectangular waveguide for introducing the microwaves from the oscillator into the chamber with a microwave plasma shown in FIG. 2 (not using a short plunger).

Figure 6:
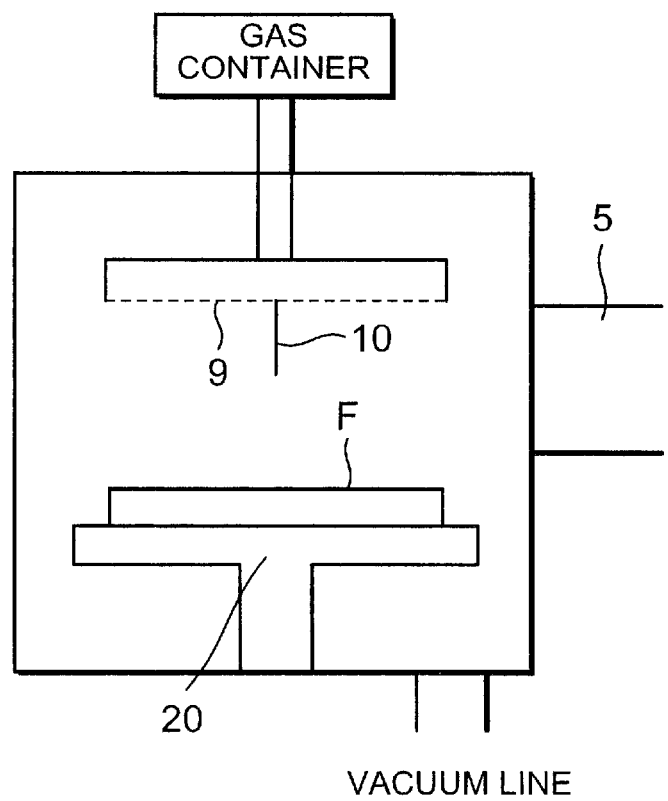
FIG. 6 is a diagram schematically illustrating the arrangement of the apparatus for treatment with a microwave plasma used in an embodiment 1.

In the chamber were installed, as shown in FIG. 6, a substrate-holding plate 20, a ceramic gas supply pipe 9 having a treating gas introduction port, and a stainless steel fine wire (antenna) 10 having a diameter of 1 mm and a length of 30 mm with its end being shaped like a needle and being installed in the gas introduction port of the pipe 9.

A polypropylene (PP) film F having a thickness of 70 $\mu$m was placed on the substrate-holding plate 20, and the vacuum pump was operated until the degree of vacuum was 2 Pa. While operating the vacuum pump, an oxygen gas was introduced until the degree of vacuum was 50 Pa, and microwaves of 0.15 KW were oscillated from the microwave oscillator. An oxygen plasma was generated in shorter than one second from the oscillation of microwaves. The surface of the PP film F was treated with the oxygen plasma for 3 seconds, and the surface of the treated PP film was measured for its applicability. As a result, the PP film F exhibited a surface energy of 30 dynes/cm before the treatment and exhibited a surface energy of 50 dynes/cm after the treatment.

Comparative Example 1

The surface of the PP film F was treated in the same manner as in Example 1 with the exception of removing the fine wire-like antenna 10 of stainless steel from the plasma-treating chamber.

No oxygen plasma was generated even after the passage of more than 10 seconds from the oscillation of microwaves, and there was no change in the applicability of the surface of the PP film F.

Example 2

A carbon film was deposited on the outer surfaces of PET caps C relying upon a microwave plasma by using a microwave oscillator of a frequency of 2.45 GHz and a maximum output of 1.5 KW, a metallic cylindrical chamber (plasma-treating) having a diameter of 300 mm and a height of 300 mm, a hydraulically operated vacuum pump for evacuating the chamber and a rectangular waveguide for introducing the microwaves from the oscillator into the chamber shown in FIG. 2 (not using a short plunger).

Figure 7:
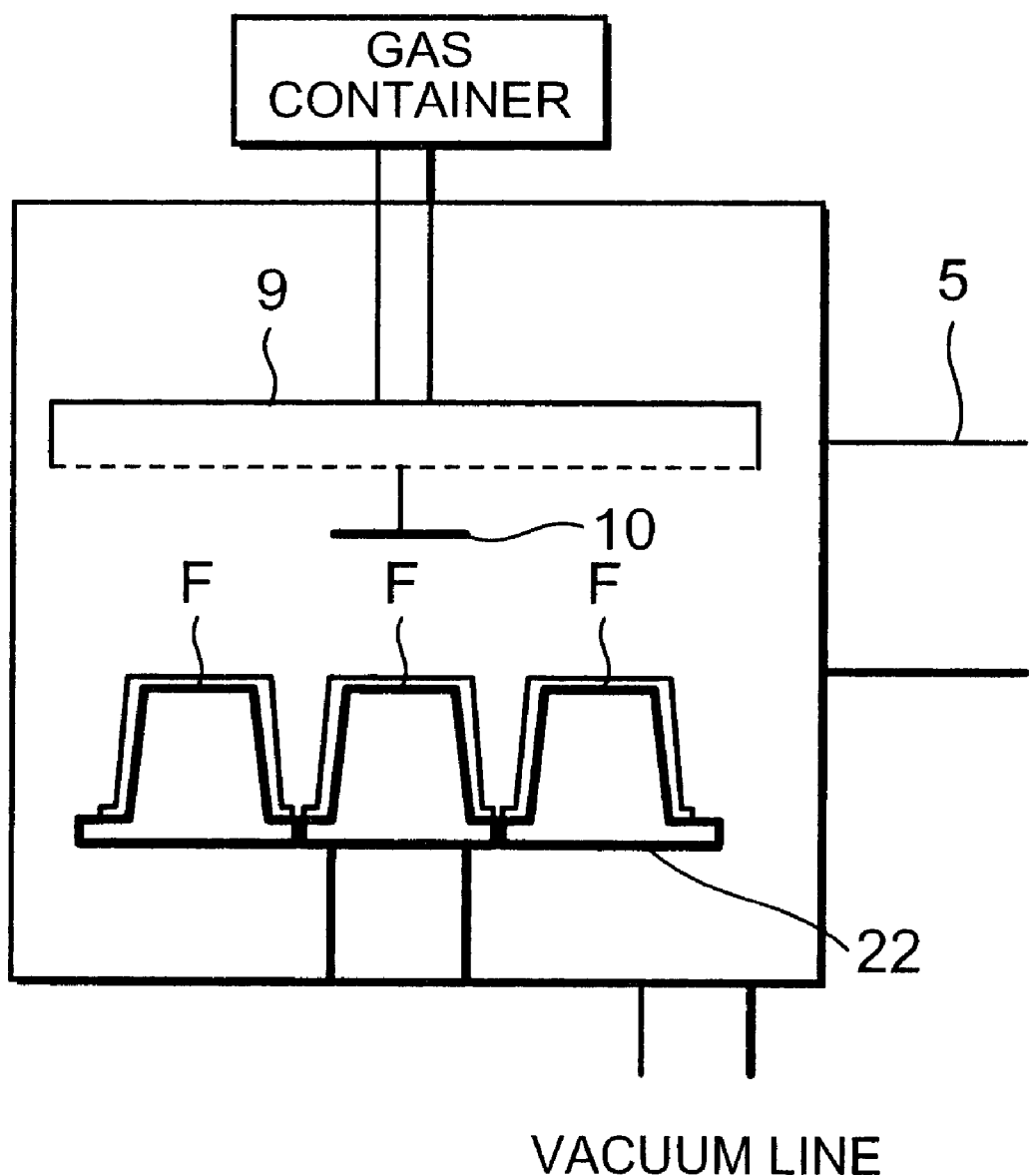
FIG. 7 is a diagram schematically illustrating the arrangement of the apparatus for treatment with a microwave plasma used in an embodiment 2.

In the chamber were installed, as shown in FIG. 7, a cup holder 22, a ceramic gas supply pipe 9 having a treating gas introduction port, and a fine-wire antenna 10 of copper having a diameter of 1 mm with its both ends being shaped like a needle and being installed in the gas introduction port of the pipe 9. There were used the antennas 10 having lengths changing from 5 to 60 mm at intervals of 5 mm. The treatment was conducted as described below.

PET cups C having a mouth diameter of 60 mm and a height of 90 mm were placed on the cup holder in a manner as shown in FIG. 7, and the vacuum pump was operated until the degree of vacuum was 2 Pa. While operating the vacuum pump, a mixture gas of an acetylene gas and an argon gas was introduced until the degree of vacuum was 50 Pa, and microwaves of 0.6 KW were oscillated from the microwave oscillator. Times were measured until an acetylene-argon plasma was generated after the oscillation of microwaves. The results were as shown in Table 1.

After the plasma has been generated, the outer surfaces of the PET cups C were treated with this plasma for 5 seconds. The surfaces of the PET cups C treated with the plasma were measured concerning the presence of a carbon film and the film thickness by using Laser-Raman and ellipsometer. It was confirmed that the carbon film had been deposited on all cups C, the thickness of the film being about 20 mm.

TABLE 1

Lengths of the fine wires and times until the acetylene-argon plasma generates

| Lengths of fine wires (mm) | | | | | | | |
|---|---|---|---|---|---|---|---|
| 5 | 10 | 15 | 20 | 30 | 40 | 50 | 60 |

| Times until plasma generates (sec) | 1.5 | 1.3 | 1.1 | 0.8 | 0.7 | 1.0 | 1.4 | 2.0 |

Comparative Example 2

The surfaces of the PET cups C were treated 5 times in the same manner as in Example 2 but removing the fine-wire antenna 10 of copper from the plasma-treating chamber.

As a result, the times until the acetylene-argon plasma generates were as shown in Table 2. As will be obvious from these results, the times until the plasma generates differed every time when the antenna 10 was not used.

TABLE 2

Times until the plasma generates

| | Number of times of testing | | | | |
|---|---|---|---|---|---|
| | 1 | 2 | 3 | 4 | 5 |
| Time until plasma generates (sec) | >10 | 9 | 5 | >10 | 8 |

>10: No plasma was generated within 10 seconds of treatment time.

>10: No plasma was generated within 10 seconds of treatment time.

Example 3

A silicon oxide film was deposited on the inner surface of a PET bottle B relying upon a microwave plasma by using a microwave oscillator of a frequency of 2.45 GHz and a maximum output of 1.5 KW, a metallic cylindrical chamber (plasma-treating chamber) having a diameter of 300 mm and a height of 300 mm, a hydraulically operated vacuum pump for evacuating the plasma-treating chamber and a rectangular waveguide for introducing the microwaves from the oscillator into the plasma-treating chamber shown in FIG. 2 (not using a short plunger).

Figure 8:
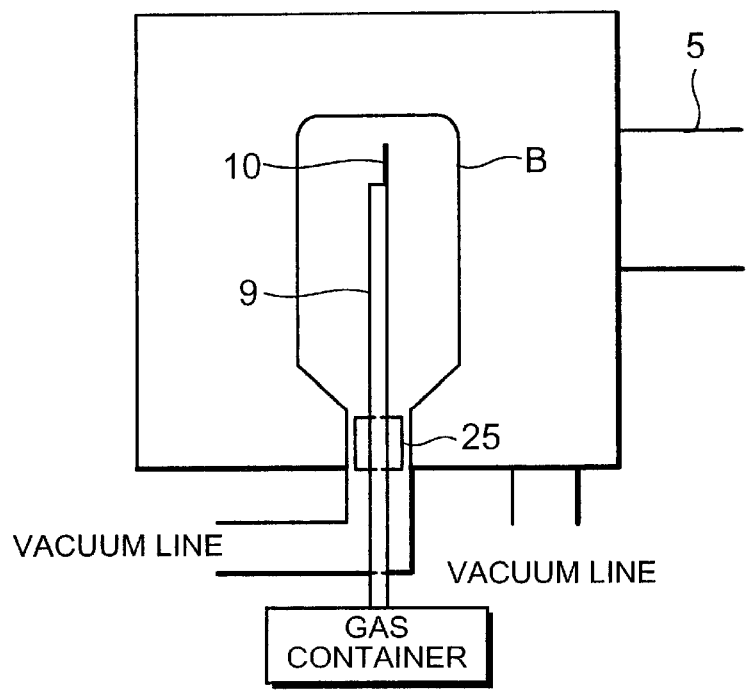
FIG. 8 is a diagram schematically illustrating the arrangement of the apparatus for treatment with a microwave plasma used in an embodiment 3.

In the plasma-treating chamber were installed, as shown in FIG. 8, a bottle holder 25, a ceramic gas supply pipe 9, and a fine-wire antenna 10 of aluminum having a diameter of 1 mm and a length of 30 mm with its end being shaped like a needle and being installed at an end of the gas supply pipe 9.

The PET bottle B having a mouth diameter of 28 mm and a height of 220 mm was placed on the bottle holder 25 in a manner as shown, and the vacuum pup was operated so that the interior of the chamber was evacuated to a degree of evacuation of 2 KPa outside the bottle and to a degree of evacuation of 2 Pa inside the bottle. While operating the vacuum pump, a nature gas of a hexamethyldisiloxane (HMDSO) gas and an oxygen gas was introduced until the degree of vacuum in the bottle was 50 Pa, and microwaves of 0.3 KW were oscillated from the microwave oscillator. Times were measured until an HMDSO-oxygen plasma was generated after the oscillation of microwaves. The results were as shown in Table 3.

Measurement was taken 5 times, and the plasma was generated in all of the testings. After the plasma has been generated, the inner surface of the PET bottle B was treated with this plasma for 5 seconds. The surface of the PET bottle B treated with the plasma was measured concerning the presence of silicon relying upon the X-ray fluorescence analysis to confirm that silicon had been deposited. Further, the deposited film was analyzed by FT-IR (Fourier transform—infrared spectroscopic analyzer) to confirm it to be a silicon oxide film.

TABLE 3

Time until plasma generates for each testing.

| | Number of times of testing | | | | |
|---|---|---|---|---|---|
| | 1 | 2 | 3 | 4 | 5 |
| Time until plasma generates (sec) | 1.5 | 1.6 | 1.4 | 1.5 | 1.4 |

Example 4

A silicon oxide film was deposited on the inner surface of a PET bottle B relying upon a microwave plasma by using a microwave oscillator of a frequency of 2.45 GHz and a maximum output of 1.5 KW, a metallic cylindrical chamber (plasma-treating chamber) having a diameter of 300 mm and a height of 300 mm, a hydraulically operated vacuum pump for evacuating the chamber and a rectangular waveguide for introducing the microwaves from the oscillator into the chamber shown in FIG. 2 (not using a short plunger).

Figure 9:
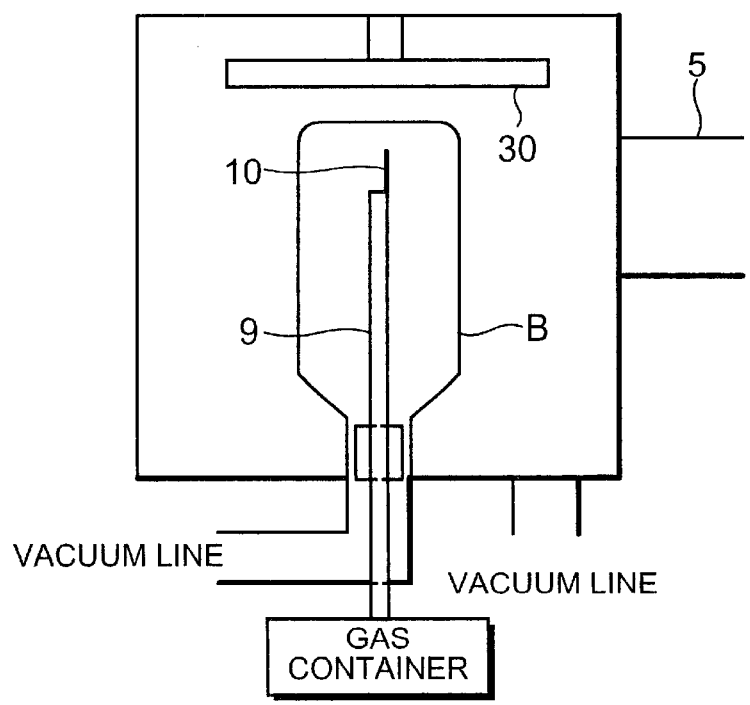
FIG. 9 is a diagram schematically illustrating the arrangement of the apparatus for treatment with a microwave plasma used in an embodiment 4.

In the plasma-treating chamber were installed, as shown in FIG. 9, a disk-shaped microwave reflector 30, a bottle bolder 25, a ceramic gas supply pipe 9, and a rectangular foil-like antenna 10 of a steel having a thickness of 100 µm, a width of 3 mm and a length of 60 mm attached to an end of the gas supply pipe 9.

The PET bottle B having a mouth diameter of 28 mm and a height of 220 mm was placed on the bottle holder 25 in a manner as shown, and the vacuum pump was operated so that the degree of vacuum outside the bottle in the plasma-treating chamber was 2 Pa and further that the degree of vacuum inside the bottle was 2 Pa. While operating the vacuum pump, a mixture gas of a hexamethyldisiloxane (HMDSO) gas and an oxygen gas was introduced until the degree of vacuum in the bottle was 100 Pa, and microwaves of 0.3 KW were oscillated from the microwave oscillator. An HMDSO-oxygen plasma was generated in the bottle in less than one second from the oscillation of microwaves. After the plasma has been generated, the inner surface of the PET bottle B was treated with this plasma for 5 seconds. The inner surface of the PET bottle B treated with the plasma was measured concerning the presence of silicon relying upon the X-ray fluorescence analysis to confirm that silicon had been deposited. The silicon compound was analyzed by FT-IR to confirm it to be a silicon oxide film.

REFERENCE EXAMPLES

In the following Reference Examples, measurements were taken in a manner as described below.

1. Nominal Filtering Precision.

The air containing sand having average particle diameters of 0.5, 1, 2, 5, 10, 20, 40, 70, 100, 120, 150, 300 and 500 µm was blown in a predetermined amount for a predetermine period of time onto a sintered product. Minimum diameters of particles that did not pass through the sintered product were measured and were regarded to be nominal filtering precisions.

2. Pressure Loss.

A conduit equipped with a flow meter and a micro-pressure gauge was installed on the primary side of the sintered product, the secondary side of the sintered product was opened to the atmospheric pressure and the air was flown at normal temperature from the primary side at a rate of one liter/min/cm$^2$. The pressure was measured on the primary side and was regarded to be a pressure loss of the sintered product.

3. Permeability of Oxygen Gas.

The interior of the bottle to be measured was substituted with a nitrogen gas, the mouth of the bottle was sealed with a laminate of aluminum foils with a sealant, the bottle was preserved in an environment of 30° C., 80% RH and 21% of oxygen. The concentration of oxygen gas in the bottle was measured with the passage of time to find the permeability of oxygen gas.

4. Loss of Carbonic Acid Gas.

A known amount of dry ice was introduced into the bottle, the mouth of the bottle was sealed with the laminate of aluminum foils with a sealant, and the loss of weight was measured with the passage of time to calculate the loss of carbonic acid gas.

Reference Example 1
(Treatment with a Microwave Plasma)

There was provided an apparatus for treatment with a plasma of a structure shown in FIG. 2 including a microwave oscillator of a frequency of 2.45 GHz and a maximum output of 1.5 KW, a metallic cylindrical chamber (plasma-treating) having a diameter of 300 mm and a height of 300 mm, a hydraulically operated vacuum pump for evacuating the chamber, and a rectangular waveguide for introducing the microwaves from the oscillator into the chamber.

In the chamber were installed, as shown in FIG. 8, a bottle holder 25, a gas supply pipe 9, and a wire-like antenna 10 of a stainless steel having a diameter of 0.5 mm and a length of 50 mm with its end being shaped like a needle and being attached to an end of the pipe 9. There was further provided a hydraulically operated vacuum pump for evacuating the interior of the bottle.

As the gas supply pipe 9, there was used a porous pipe with bottom made of a sintered stainless steel having an outer diameter of 10 mm, a length of 180 mm and a nominal filtering precision of 120 µm.

A cylindrical polyethylene terephthalate bottle (hereinafter referred to as PET bottle) having a mouth diameter of 28 mm and a height of 220 mm was placed on the bottle holder 25, and the interior of the plasma-treating chamber was evacuated so that the degree of vacuum was 2 KPa on the outside the bottle. While operating the vacuum pump, there were introduced 2 sccm of a hexamethyldisiloxane (HMDSO) gas, 20 sccm of an oxygen gas and 50 sccm of an argon gas to adjust the degree of vacuum in the bottle to be 50 Pa. Microwaves of 300 watts were oscillated from the microwave oscillator to form a plasma in the bottle thereby to conduct the treatment with a plasma for 10 seconds.

Measured results of the pressure loss of the porous pipe, oxygen gas permeability of the obtained PET bottle and loss of carbonic acid gas, as well as the gas barrier property of the treated bottle were as shown in Table 4.

Reference Example 2

The PET bottle was treated with a plasma in the same manner as in Reference Example 1 but using the porous pipe made of a sintered bronze having a nominal filtering precision of 70 µm. The results of measurement and evaluation were as shown in Table 4.

Reference Example 3

The PET bottle was treated with a plasma in the same manner as in Reference Example 1 but using the porous pipe made of a sintered polypropylene having a nominal filtering precision of 150 µm. The results of measurement and evaluation were as shown in Table 4.

Reference Example 4

The PET bottle was treated with a plasma in the same manner as in Reference Example 1 but using the porous pipe made of a sintered stainless steel having a nominal filtering precision of 40 µm. The results of measurement and evaluation were as shown in Table 4.

Reference Example 5

The PET bottle was treated with a plasma in the same manner as in Reference Example 4 but using the porous pipe having a nominal filtering precision of 20 µm. The results of measurement and evaluation were as shown in Table 4.

Reference Example 6

The PET bottle was treated with a plasma in the same manner as in Reference Example 4 but using the porous pipe having a nominal filtering precision of 10 μm. The results of measurement and evaluation were as shown in Table 4.

Reference Example 7 (COMPARATIVE)

The PET bottle was treated with a plasma in the same manner as in Reference Example 1 but using a cylindrical stainless steel pipe having an outer diameter of 7 mm, an inner diameter of 4 mm and a length of 180 mm and having 28 holes of a diameter of 0.8 mm perforated therein maintaining intervals of 15 mm in the longitudinal direction, and intervals of 90 degrees in the circumferential direction, instead of using the gas supply pipe 9 employed in Reference Example 1. The results of measurement and evaluation were as shown in Table 4.

Reference Example 8 (COMPARATIVE)

The PET bottle was treated with a plasma in the same manner as in Reference Example 7 but using a stainless steel pipe having 44 holes of a diameter of 0.5 mm perforated therein maintaining intervals of 10 mm in the longitudinal direction and interval of 90 degrees in the circumferential direction. The results of measurement and evaluation were as shown in Table 4.

Reference Example 9 (COMPARATIVE)

The PET bottle was treated with a plasma in the same manner as in Reference Example 1 but using the porous pipe having a nominal filtering precision of 0.5 μm. The results of measurement and evaluation were as shown in Table 4.

Reference Example 10 (COMPARATIVE)

The PET bottle was treated with a plasma in the same manner as in Reference Example 1 but using the porous pipe having a nominal filtering precision of 500 μm. The results of measurement and evaluation were as shown in Table 4.

What we claim is:

1. A method of treatment with a microwave plasma by maintaining a reduced pressure in a plasma-treating chamber for treatment with a plasma in which a substrate that is to be treated is contained, introducing a treating gas into the plasma-treating chamber and introducing microwaves into the chamber, wherein a metallic antenna is disposed in the chamber separate from a means for introducing microwaves into the plasma-treating chamber, said metallic antenna concentrating microwaves emitted in the chamber so as to promote the formation of plasma.

2. A method of treatment with a microwave plasma according to claim 1, wherein on a surface of the metallic antenna is formed a film of the same kind as the film formed on a surface of the substrate by the treatment with a plasma.

3. A method of treatment with a microwave plasma according to claim 1, wherein the metallic antenna has a length which is not smaller than 0.02 times as long as the wavelength of the microwaves.

4. A method of treatment with a microwave plasma according to claim 1, wherein an end of the metallic antenna is positioned on at extension in the horizontal direction from an upper end or a lower end of a microwave introduction port formed in said plasma-treating chamber, or in the vicinity thereof.

5. A method of treatment with a microwave plasma according to claim 1, wherein a supply pipe for supplying the treating gas is disposing in said plasma-treating chamber.

6. A method of treatment with a microwave plasma according to claim 5, wherein said metallic antenna is so disposed as to be directed outward from an end of said supply pipe.

7. A method of treatment with a microwave plasma according to claim 5, wherein said supply pipe is made of a metal and also serves as said metallic antenna.

8. A method of treatment with a microwave plasma according to claim 5, wherein said supply pipe is made of a porous material.

TABLE 4

|  | Gas supply pipe | Material | Nominal filtering accuracy (μm) | Pressure loss (Kpa) | Oxygen permeability (cc/m²/day/atm) | Loss of carbonic acid gas (%/week) | Evaluation of gas barrier property |
|---|---|---|---|---|---|---|---|
| Ref. Ex. 1 | Porous pipe | stainless | 120 | 0.2 | 0.5 | 0.3 | ○ |
| Ref. Ex. 2 | Porous pipe | bronze | 70 | 0.09 | 0.5 | 0.3 | ○ |
| Ref. Ex. 3 | Porous pipe | polypropylene | 150 | 0.02 | 0.5 | 0.3 | ○ |
| Ref. Ex. 4 | Porous pipe | stainless | 40 | 0.81 | 0.5 | 0.3 | ○ |
| Ref. Ex. 5 | Porous pipe | stainless | 21 | 1.3 | 0.6 | 0.3 | ○ |
| Ref. Ex. 6 | Porous pipe | stainless | 10 | 2.7 | 0.7 | 0.3 | ○ |
| Ref. Ex. 7 | Perforated pipe | stainless | — | 0.0002 | 5.3 | 1.5 | X |
| Ref. Ex. 8 | Perforated pipe | stainless | — | 0.015 | 5.2 | 1.5 | X |
| Ref. Ex. 9 | Porous pipe | stainless | 0.5 | 30 | 2.5 | 1.2 | X |
| Ref. Ex. 10 | Porous pipe | stainless | 500 | 0.01 | 4.8 | 1.4 | X |

Note: ○: good, X bad

9. A method of treatment with a microwave plasma according to claim 8, wherein said porous material comprises a porous metal, a ceramic material, a plastic material or a fiber.

10. A method of treatment with a microwave plasma according to claim 8, wherein said porous material has a nominal filtering accuracy in a range of from 1 to 300 μm and a pressure loss on the secondary side under the atmospheric pressure in a range of from 0.01 to 25 KPa.

11. A method of treatment with a microwave plasma according to claim 1, wherein the substrate to be treated is a plastic substrate.

12. A method of treatment with a microwave plasma according to claim 1, wherein the treating gas is a carbon-precursor gas.

13. A method of treatment with a microwave plasma according to claim 1, wherein the treating gas contains an organosilicon compound and oxygen.

14. A method of treatment with a microwave plasma according to claim 1, wherein the substrate to be treated is a plastic container, the interior and/or the exterior of the plastic container is maintained in a reduced-pressure atmosphere containing a treating gas, and a glow discharge is produced by microwaves inside of the container and/or outside of the container in order to chemically deposit a film on the inner surface of the container and/or on the outer surface of the container.

15. A method of treatment with a microwave plasma according to claim 14, wherein the plastic container is held in the plasma-treating chamber, the exterior of the plastic container and the interior of the plastic container are maintained in an air-tight state, the interior of the plastic container is maintained in a reduced-pressure condition in which a microwave discharge takes place in a state where a treating gas is introduced into the plastic container, the exterior of the plastic container is maintained in a reduced-pressure condition in which no microwave discharge takes place in a state where the treating gas is introduced into the plastic container, and microwaves are introduced into the exterior of the plastic container in the plasma-treating chamber.

16. A method of treatment with a microwave plasma according to claim 14, wherein a microwave reflector is disposed in the plasma-treating chamber so as to be opposed to the bottom of said plastic container.

17. A method of treatment with a microwave plasma by maintaining a reduced pressure in a plasma-treating chamber for treatment with a plasma in which a substrate that is to be treated is contained, introducing a treating gas into the plasma-treating chamber and introducing microwaves into the chamber, wherein metallic antenna means is disposed in the chamber for emitting electrons which promote the formation of plasma upon introducing microwaves into the chamber, said metallic antenna being provided separate from a means for introducing microwaves into the plasma-treating chamber.

* * * * *